United States Patent [19]

Arimoto et al.

[11] Patent Number: 5,759,292
[45] Date of Patent: Jun. 2, 1998

[54] SOLAR CELL

[75] Inventors: Satoshi Arimoto; Hiroaki Morikawa; Yoichiro Nishimoto, all of Tokyo, Japan

[73] Assignee: Mitsubishi Denki Kabushiki Kaisha, Tokyo, Japan

[21] Appl. No.: 689,002

[22] Filed: Jul. 30, 1996

[30] Foreign Application Priority Data

Feb. 8, 1996 [JP] Japan ................... 8-022683

[51] Int. Cl.$^6$ ............................. H01L 31/0248
[52] U.S. Cl. ..................... 136/256; 136/261; 438/96; 438/98
[58] Field of Search ................... 437/2–5, 939; 136/256, 261; 438/73, 78, 81, 96, 98

[56] References Cited

U.S. PATENT DOCUMENTS

| | | | |
|---|---|---|---|
| 3,620,829 | 11/1971 | Beck | 136/256 |
| 4,078,945 | 3/1978 | Gonsiorawski | 136/256 |
| 4,227,942 | 10/1980 | Hall | 136/255 |
| 4,640,001 | 2/1987 | Koiwai et al. | 437/2 |
| 4,675,466 | 6/1987 | Ramaprasad | 136/244 |

OTHER PUBLICATIONS

"24% Efficient Silicon Solar Cells", Jianhua Zhao et al. 1994 IEEE First World Conference on Photovoltaic Conversion, Hawaii, vol. II, pp. 1477–1480 (1994).

"Defect passivation in multicrystalline–Si materials by plasma–enhanced chemical vapor deposition of $SiO_2$ SiN coatings", Z. Chen et al. Applied Physics Letters, vol. 65, pp. 2078–2080 (1994).

"Short Communication: Solar Cell Efficiency Tables (Version 6)", Martin A. Green et al. Progress in Photovoltaics, vol. 3, pp. 229–233 (1995).

"Prospect of the High Efficiency for the Vest (Via–hole Etching for the Separation of Thins films) Cell", M. Deguchi et al. 1994 IEEE First World Conference on Photovoltaic Energy Conversion, Hawaii, vol. II, pp. 1287–1290 (1994).

Primary Examiner—Nam Nguyen
Attorney, Agent, or Firm—Sughrue, Mion, Zinn, Macpeak & Seas, PLLC

[57] ABSTRACT

A solar cell has a high ability to prevent recombination of electrons near the cell surface, wherein a surface of a p-type substrate at a surface is provided with an n-type region subjected to a treatment with a phosphorus containing acid and a silicon nitride layer is then directly formed on the n-type region.

The solar cell can be prepared at a low temperature by a method comprising 1) a step of subjecting the n-type region to a phosphorus containing acid treatment at a low temperature and 2) a step of forming a silicon nitride by a vacuum and thermal CVD method.

12 Claims, 4 Drawing Sheets

SOLAR CELL

BACKGROUND OF THE INVENTION

1. Field of the Invention

The present invention relates generally to a solar cell having an ability to prevent recombination of electrons at the cell surface and a mass productive method therefor.

2. Description of Related Art

Solar cells generally have a p-n junction in a semiconductor body, wherein hole-electron pairs are generated by the energy of photons absorbed from the sun light. Holes are forced to the p-side of the junction while the electrons are forced to the n-side of the junction by means of diffusion caused by a built-in electric field at the p-n junction, resulting in a voltage difference between the two regions (the p-region is plus and the n-region is minus). Therefore, when n-type diffusion layers 2, 4 are formed on a p-type substrate 1 and output terminal electrodes 5, 6 are connected to the n-type layer 4 and the p-type substrate 1 as shown in FIG. 6, an electrical current flows and useful electrical power is available.

In the solar cell, if the electrons recombine with the holes or defects near the surface of the n-type diffusion layer 2, the generated current decreases and thus the photovoltaic energy conversion efficiency lowers.

In order to prevent the recombination of electrons, it has been proposed to lower the dopant impurity concentration in the n-type diffusion layer as much as possible. For example, in the case of the n-type diffusion layer having a sheet resistance of 10 to 30 $\Omega/\square$, the top most surface area has an impurity concentration as great as $10^{21}$cm$^{-3}$, which causes a remarkable amount of carrier recombination and reduces the amount of incident light absorption by narrowing of the forbidden band. However, in order to maintain good cell performance, a part of the diffusion layer, to which the n-type electrode is attached, should be to some degree high in the dopant impurity concentration because the contact resistance between the electrode and the diffusion layer should be kept small. Therefore, a two step diffusion process has been applied to the substrate as shown in FIG. 6 to make the impurity concentration in the diffusion layer partially low and partially high.

In the conventional process of FIGS. 6A and 6B, the surface of a p-type substrate 1 made of monocrystal or polycrystal Si is converted into an n-type diffuision region 2 by means of a thermal diffusion of phosphorus (P). The resultant n-type diffusion region 2 should be in low dopant impurity concentration to realize a higher photovoltaic efficiency. For example, the sheet resistance is set at 150 to 200 $\Omega/\square$ (dopant impurity concentration of $10^{19}$cm$^{-3}$ or less).

In the step of FIG. 6C, an oxidation film 3 is formed on the n-type diffusion layer 2 by a thermal oxidation method. The oxidation film is a film of SiO$_2$ having a thickness of 100 to 1,000 Å. The oxidation process is carried out typically in an O$_2$ atmosphere at a temperature of about 1,000° C.

In the step of FIG. 6D, a part of the oxidation film is removed by means of chemical-etching treatment and the remaining film is used as a diffusion mask. A second thermal diffusion of an n-type dopant impurity, for example, phosphorus(P) is carried out to form a second diffusion regions 4 having a sheet resistance of 10 to 20$\Omega/\square$ (dopant impurity concentration of $10^{20}$cm$^{-3}$ to $10^{21}$cm$^{-3}$or less).

In an electrode forming step of FIG. 6E, an n-type electrode 5 is formed on the second diffusion regions 4 while a p-type electrode 6 is formed on the opposite surface by means of vacuum evaporation of Ag or Al. Finally, as shown in FIG. 6F, an anti-reflection film 11 is formed on the thermal oxidation film 3 by means of plasma CVD to obtain a completed solar cell.

In the above conventional method, there are some significant problems. One of them is the requirement of a precise control of temperature during the oxidation layer formation step in FIG. 6C because such high temperature process often deteriorates the crystal quality. The second is the inapplicability of the formation of electrodes in FIG. 6E to mass production because vacuum systems must be used.

SUMMARY OF THE INVENTION

Accordingly, it is an object of the present invention to provide a solar cell having the ability to prevent or prohibit the recombination of electrons near the cell surface.

Another object of the present invention is to provide a method of preparing the same with ease at a low cost.

As a result of our researches in accomplishing the above and other objects, it has been found that a treatment of the n-type semiconductor region with a phosphorus containing acid is most effective to prevent the recombination of electrons near the cell surface.

Therefore, according to a first aspect of the present invention, there is provided a method of preparing a solar cell which comprises:

1) a step of forming an n-type region on a p-type substrate, and 2) a step of subjecting the n-type region to a treatment with a phosphorus containing acid at a low temperature.

The treatment with a phosphorus containing acid may be carried out in a vapor phase or in a liquid phase. Dipping the substrate provided with said n-type region into a phosphorus containing acid aqueous solution is preferred because it is easy to perform.

The phosphorus containing acid aqueous solution may be an aqueous solution of one or more selected from the group consisting of orthophosphoric acid (H$_3$PO$_4$), phosphorus acid (H$_3$PO$_2$), metaphosphoric acid (HPO$_3$), sodium phosphate (Na$_3$PO$_4$), sodium phosphite (Na$_3$PO$_2$), sodium metaphosphate (NaPO$_3$), potassium phosphate (K$_3$PO$_4$), potassium phosphite (K$_3$PO$_2$), potassium metaphosphate (KPO$_3$), ammonium phosphate [(NH$_4$)$_3$PO$_4$], ammonium phosphite [(NH$_4$)$_3$PO$_2$)] and ammonium metaphosphate [(NH$_4$)PO$_3$]. The concentration of aqueous phosphorus containing acid solution may be more than 1 wt. %, which can be determined considering a treatment temperature and a treatment time.

Said phosphoric acid treatment may be carried out at room temperature to 200° C. because the lower treatment temperature is effective to prevent deterioration of the crystal quality of the resultant solar cell and is also applicable to an amorphus semiconductor material (amorphus silicon) which is superior in internal quantum efficiency in regard to the sunlight having a wavelength of about 500 nm.

A dipping time of more than 30 minutes is preferred because it is easy to control the treatment step.

The n-type region of the substrate after said phosphorus containing acid treatment should be subjected to a treatment for forming a silicon nitride layer, because it has been found that the silicon nitride layer formed on the n-type region is more effective to improve the internal quantum efficiency than the conventional SiO$_2$ layer. The step of forming the silicon nitride layer can be carried out by a plasma CVD method or a vacuum and thermal CVD method. Although both methods have advantages in that they are carried out at a lower temperature (about 300°–400° C. ) than the conventional thermal oxidation method, the former plasma CVD method requires a higher vacuum apparatus which can produce a uniform plasma having a large area, so that it is difficult to realize a mass production and thus a low cost production. On the other hand, the latter CVD method can obviate the above problems and thus realizes a mass production and a low cost production in regard to the nitride layer formation.

Therefore, according to a second aspect of the present invention, there is provided a solar cell having an ability to prevent recombination of electrons near the cell surface, which comprises a p-type substrate with a surface provided with an n-type region subjected to a treatment with a phosphorus containing acid and a silicon nitride layer formed on the treated n-type region.

In a preferred embodiment, the solar cell may have an ń-type region whose impurity concentration before said phosphorus containing acid treatment is on the order of $10^{18}$ to $10^{21} cm^{-3}$ and a resulting contact resistance between the n-type region and a terminal electrode is less than about $10^{-2} \Omega cm^2$.

BRIEF DESCRIPTION OF THE DRAWINGS

The above and other objects and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

Embodiment 1

As shown in FIG. 1, there is shown a process diagram wherein a p-type monocrystal Si substrate 1 of a resistivity of about 2Ωcm, which has a surface orientation of (001) and a thickness of about 500μm.

Figure 1A:
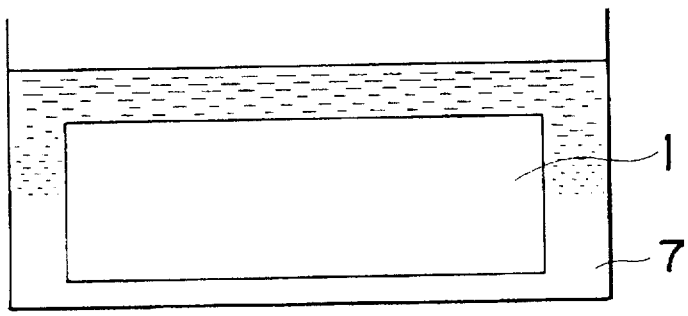
FIG. 1A–1F are process diagrams showing steps of preparing a solar cell according to the present invention.
Figure 1B:
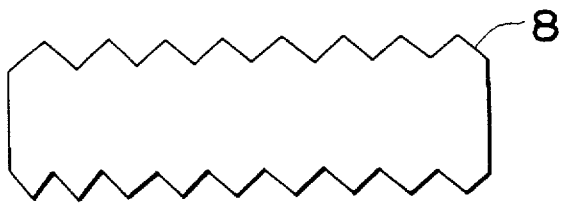

In the step of FIG. 1A, the monocrystal Si substrate is subjected to a surface etching in aqueous solution of 1% potassium hydroxide (KOH) 7, so that many pyramidal structures having (111) surfaces and a height of several μm are formed on the surface, to form what is called a textured structure. The textured structure can increase the absorption of sunlight because of reduction of reflectivity at the surface and increased reflection into the cell, which improves the solar cell characteristics. As shown in the step of FIG. 1B, the resultant substrate 1 is provided with the textured structures at both sides. The textured structures may be formed by another processing such as sandblasting or wiresawing.

Figure 1C:
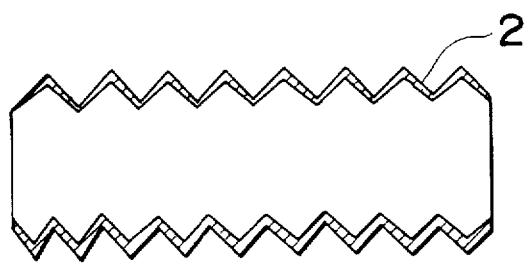

In the step of FIG. 1C, there is shown the formation of the n-type diffusion layer 2, wherein the diffusion process is carried out by treating the p-type substrate 1 in an atmosphere of $O_2$ and $N_2$ gas mixture including $POCl_3$ at about 850° C. The resultant n-type layer has a sheet resistance of 30Ω/□ (dopant concentration of $1 \times 10^{21} cm^{-3}$). Dopping of the impurity atoms may also be carried out by means of ion-implantation. In place of (P), another group (V) atoms may be used.

Figure 1D:
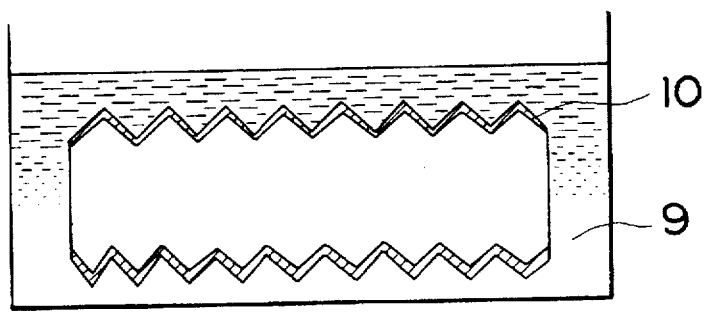

In the step of FIG. 1D, there is shown a process of treating with a phosphorus containing acid, wherein the substrate 1 provided with the n-type region 2 is dipped into a $H_3PO_4$ aqueous solution to treat the n-type region 2 with the phosphorus containing acid. The phosphorus containing acid solution comprises $H_3PO_4$ and $H_2O$ at a mixture ratio =2:1 and is heated to 130° C. After dipping for 30 minutes, the substrate 1 is subjected to washing and drying processes. In the figure, the acid treated n-type diffusion layer is denoted by 10in in order to distinguish it from the non-treated n-type diffusion layer 2.

Figure 1E:
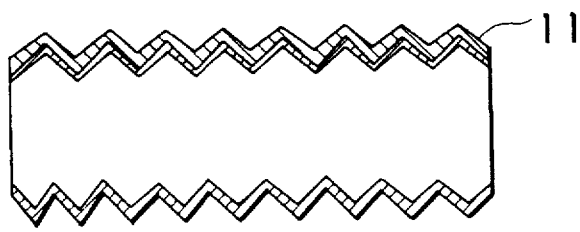

In the step of FIG. 1E, there is shown an anti-reflection coating film consisting of SiN formed on the acid treated n-type diffusion layer 10 by a process wherein the substrate 1 is treated by means of a vacuum and thermal CVD using $SiCl_2H_2$ and $NH_3$ to form SiN film 11.

Figure 1F:
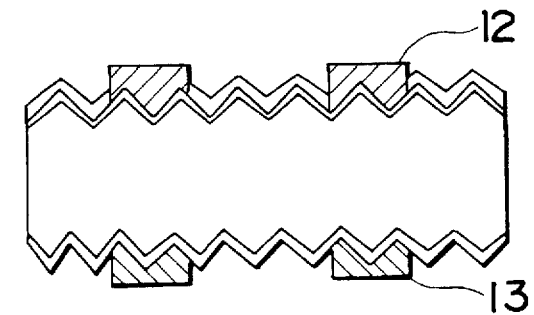

In the step of FIG. 1F, there is shown an electrode formation process wherein the substrate 1 is subjected to a patterning treatment by means of screen printing, and then to an etching treatment wherein SiN layer is selectively removed by use of hydrofluoric acid at electrode forming areas, on which n-type electrodes 12 are formed by subjecting an Ag paste to a firing treatment in dry air at about 700 °C. AgAl or Al paste is applied to the substrate and fired as in the above to obtain p-type electrodes 13.

The resultant solar cells have the following characteristics.

Figure 2:
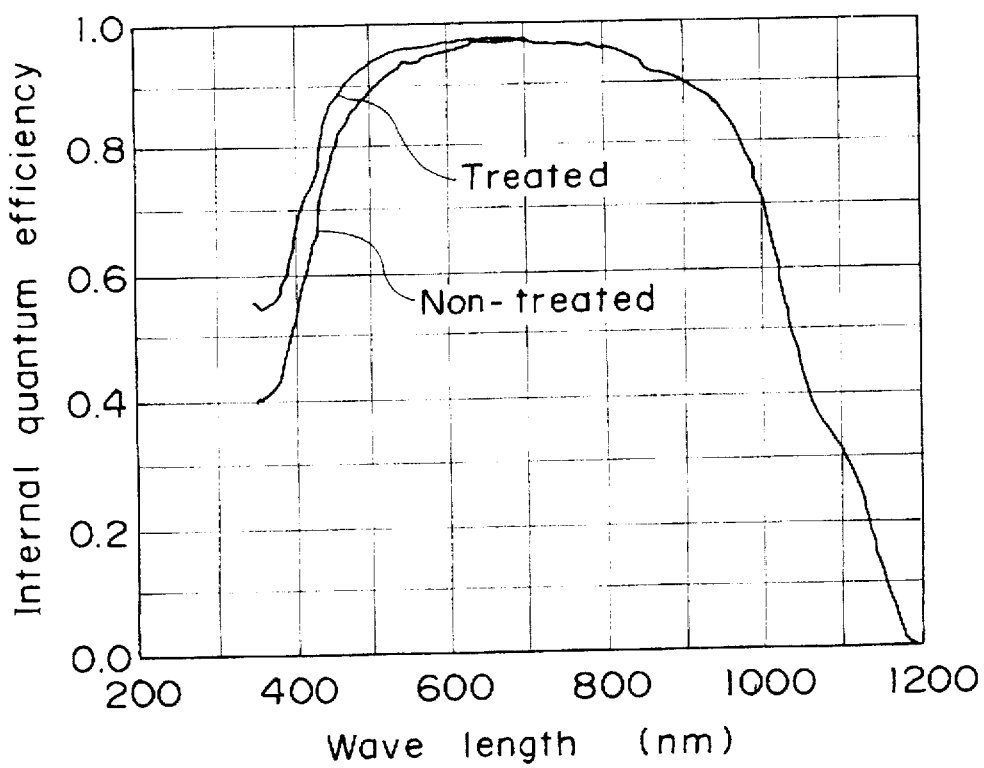
FIG. 2 is a graph showing the relation between wavelength of incident light and internal quantum efficiency for a first embodiment according to the present invention.

FIG. 2 shows comparison between the non-treated solar cell and the treated solar cell in regard to the internal quantum efficiency. The vertical axis of FIG. 2 indicates an internal quantum efficiency while the horizontal axis indicates a wavelength of incident light into the solar cell.

It can be seen from FIG. 2, that at about 400 nm of incident wavelength, the treated solar cell has a larger efficiency than that of the non-treated solar cell and similarly at about 400 to 700 nm, the treated solar cell has a larger efficiency (corresponding to the photovoltaic energy conversion efficiency) as shown by the gap between the two lines. The difference in efficiencies at is caused by preventing recombination of electrons near the cell surface. This effect of the phosphorus containing acid treatment can be proved by the fact that the sheet resistance of the n-type diffusion layer 2 can be improved from 30 Ω/□ (dopant concentration of $1 \times 10^{21} cm^{-3}$) in the non-treated case to 35 Ω/□ (dopant concentration of $8 \times 10^{20} cm^{-3}$) in the treated case.

Embodiment 2

Figure 3A:
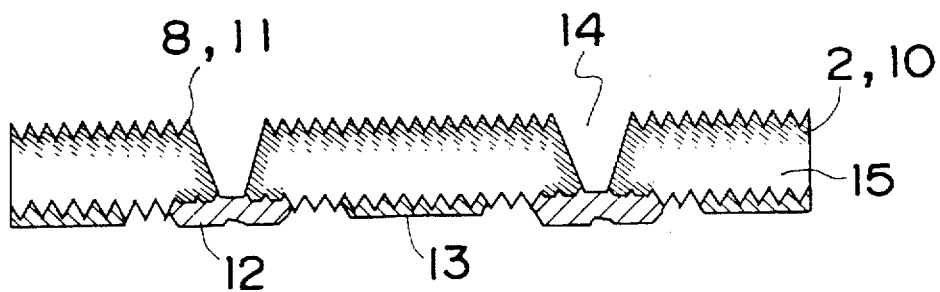
FIG. 3A is a sectional view showing a second embodiment according to the present invention.
Figure 3B:
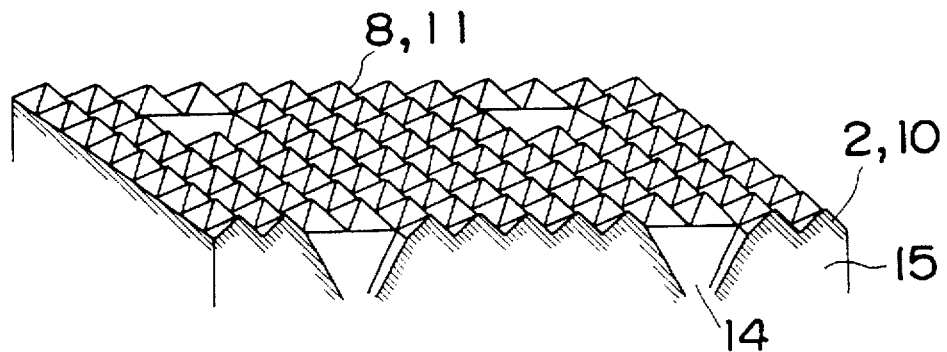
FIG. 3B is a perspective view showing a second embodiment according to the present invention.

FIG. 3A shows a sectional construction of a second embodiment made by the method according to the present invention and FIG. 3B shows a perspective view of the second embodiment.

The solar cell comprises a substrate 15 having a pair of textured surfaces 8 at both sides and via holes 14 which are provided with n-type layers 10 at the side walls, wherein n-type electrodes 12 are arranged at the back surface, resulting in an effective increase of photo-current without losses of due to front surface electrodes.

The substrate 15 is of thin film polysilicon 15 having a thickness of 60 to 100 μm formed on an $SiO_2$ insulative layer by a zone-melting recrystallization method. The via holes 14 are made through the substrate 15 and only the insulative layer on the substrate 15 is etched to separate the thin polycrystal Si film. On the Si film, the n-type layer 2 is formed on the top surface while the n-type electrodes 12 and the p-type electrodes 13 are formed on the bottom surface. Finally, the anti-reflection coating film 11 is formed on the n-type diffusion layer 10 to complete a solar cell of a type, which is proposed in Conference Record of *IEEE First World Conference on Photovoltaic Energy Conversion*, Hawaii, vol.II, pp. 1287(1994). In this case, the n-type diffusion layer has a sheet resistance of 30 Ω/□ which sometimes allows carrier recombination near the surface of the n-type diffusion layer.

In the embodiment, the phosphorus containing acid treatment is applied to the substrate 15, wherein the substrate 15 provided with the n-type diffusion layer 2 is dipped into a phosphorus contaning acid aqueous solution to obtain a treated n-type diffusion layer 10 and then the electrodes 12, 13 and the anti-refection coating film 11 are formed thereon in the same way as in the embodiment 1 to complete a solar cell having an ability to prevent recombination of electrons and a high photovoltaic energy conversion efficiency.

In order to make the effect of the present invention clearer, in place of polycrystal Si, a substrate made of 100 μm etched monocrystal Si is provided and subjected to the same treatment as in the above process.

Figure 4:
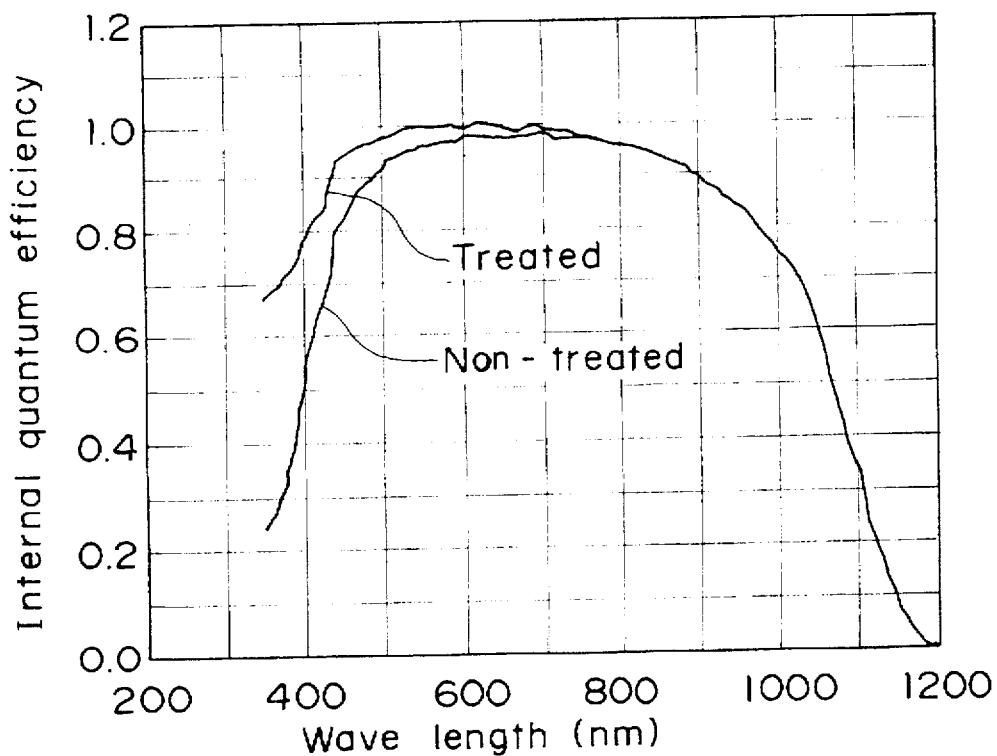
FIG. 4 is a graph showing the relation between wavelength of incident light and internal quantum efficiency of the second embodiment according to the present invention.

FIG. 4 shows the result of comparing the variation of internal quantum efficiency of the solar cell made of the thin monocrystal Si substrate as a function of the wavelength of the incident light. From FIG. 4, at around 400 nm the effect of the phosphorus containing acid treatment wherein lowering of the efficiency is prevented. Further, the short-circuit photo current density of the non-treated solar cell is 34 $mA/cm^2$ and is increased to 36 $mA/cm^2$ by means of the phosphorus containing acid treatment.

Figure 5:
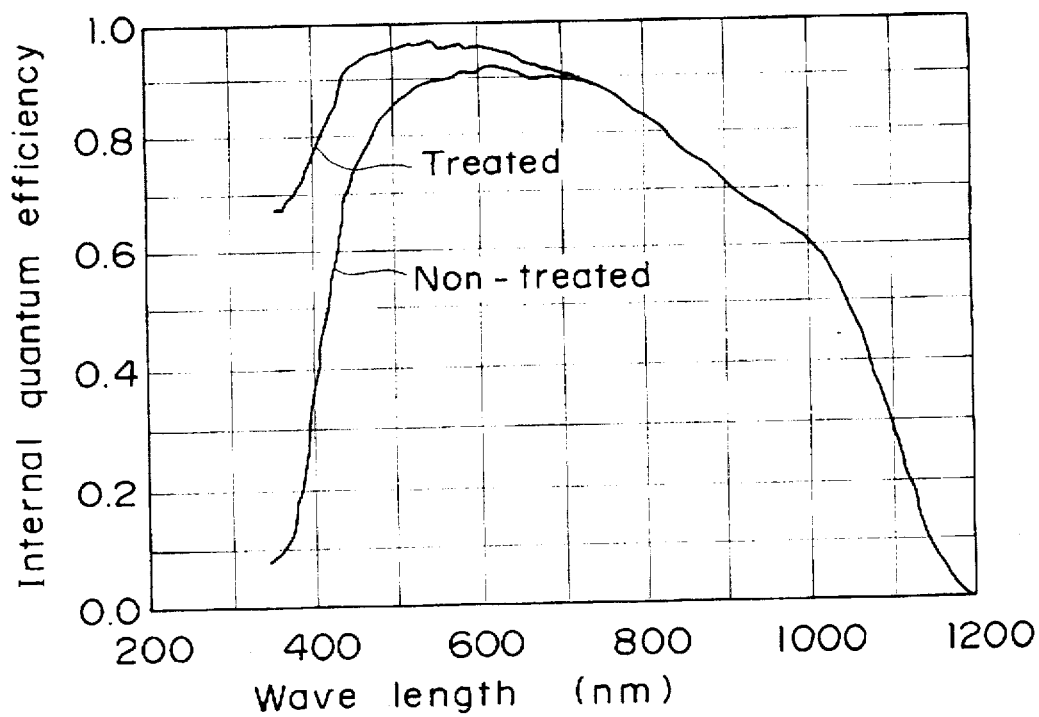
FIG. 5 is a graph showing the relation between wavelength of incident light and internal quantum efficiency of a third embodiment according to the present invention.
Figure 6A:
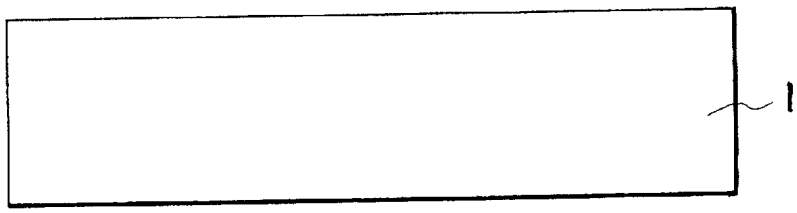
FIG. 6A–6F are conventional process diagrams showing steps of preparing a solar cell.
Figure 6B:
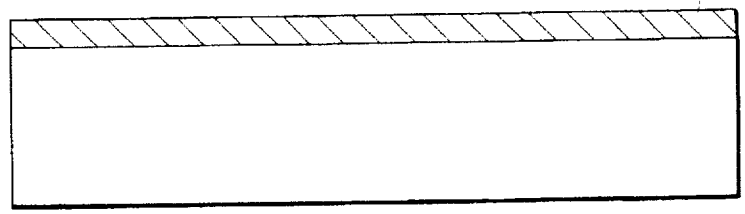
Figure 6C:
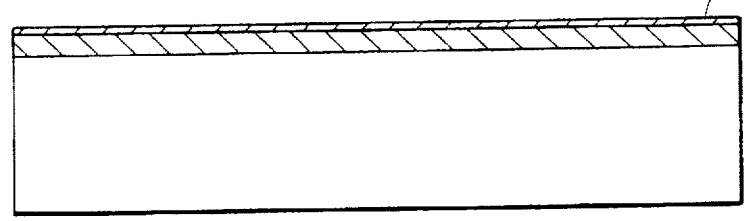
Figure 6D:
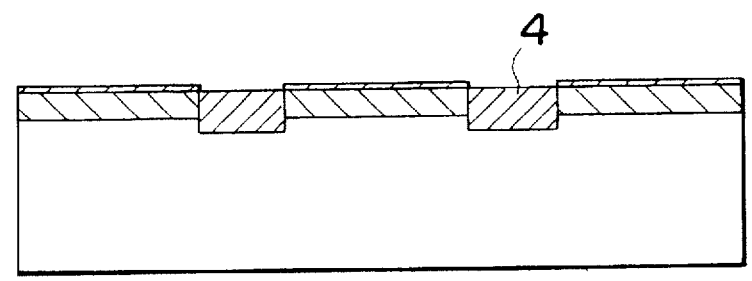
Figure 6E:
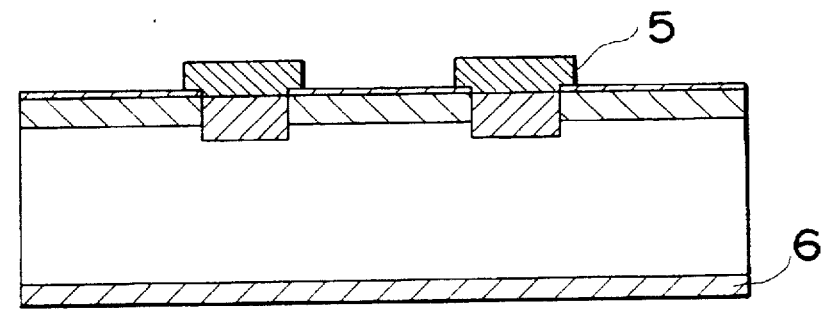
Figure 6F:
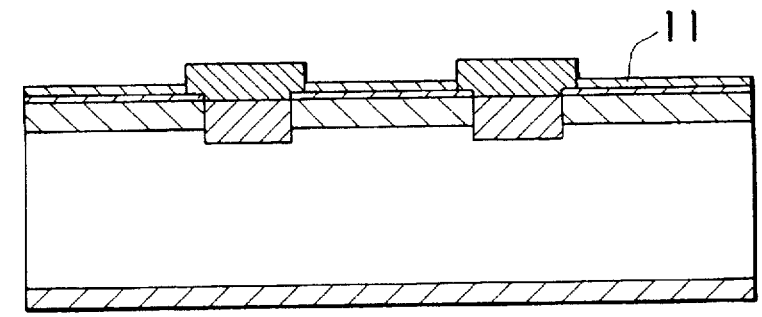

FIG. 5 shows the result of comparing the internal quantum efficiency of the solar cell made of polycrystal Si substrate as a function of the wavelength of the incident light. As is apparent from FIG. 5, at around 400 nm there is found a remarkable effect of the phosphorus containing acid treatment. Further, the short-circuit photo-current density of the non-treated solar cell is 29 $mA/cm^2$ and is increased to 32 $mA/cm^2$ by means of the phosphoric acid treatment. Please note, however, that the characteristics of FIG. 5 is inferior than that of FIG. 4 is because of the difference of the crystal quality.

In the cases of the thin film substrates shown in FIGS. 4 and 5, it is found that a large photo-current density is obtained although the n-type diffusion layer has a low sheet resistance of 30 Ω/□. This seems to be due to;

1) an increased effective absorption of incident light into the solar cell caused by back side reflection due to the back side textured structure 8 as shown in FIG. 3;

2) an electric field effect caused by the p-n junction at the back side; and 3) prevention of carrier recombination.

This effect corresponds to the phenomenon that the internal quantum efficiency line is raised at around 1000 nm in FIG. 5. In the case where there is no provision of this structure at the back side, the internal quantum efficiency is lower than that of the above case, so that the curve line falls more smoothly than shown in FIG. 5.

Embodiment 3

An amorphous solar cell is prepared in the same way as above except for using a substrate made of hydrogenated amorphous Si and comprising p-i-n junction layers, wherein the n-type layers is typically doped with (P).

The n-type diffusion layer is subjected to a dipping treatment in the phosphoric acid at a low temperature of 100 and several 10° C., which causes substantially no damage to the amorphous silicon materials. Considering that it is almost impossible for the amorphous silicon materials to be subjected to a high temperature process for forming the thermal oxidation film, the present invention is more effective for the amorphous substrate than the conventional method.

Embodiment 4

In this case, the p-type substrate is provided with an n-type layer of amorphous or polycrystal material by means of a conventional plasma CVD method, an conventional photo CVD method, or a conventional thermal CVD method using a gas mixture of $SiH_4$ and $PH_3$. The n-type layer on the substrate is subjected to the same phosphoric acid treatment as in the above to provide a solar cell. It is observed that the resultant solar cell has the same ability to prevent carrier recombination as the above cell(s).

Embodiment 5

In this case, p-type substrates (thickness:350 μm, resistivity: 4–5 Ω/□) made of a cast polycrystal Si are provided with an n-type diffusion layer having a sheet resistance of 60 Ω/□. One of them is subjected to the same phosphorus containing acid treatment as above and then to a vacuum and thermal CVD treatment for forming an n-type low reflectance layer, wherein $SiCl_2H_2$ (40 SCCM) and $NH_3$ (800 SCCM) are thermally reacted under a vacuum pressure of 0.3 torr at a temperature of 760° C. On the other hand, an other substrate is subjected to an oxidation process wherein heating in an $O_2$ atmosphere at 1000° C. for 5 minutes is carried out to form an oxidation film having a thickness of 200 Å and then the same vacuum and heat CVD treatment as above is performed.

It is observed that the former solar cell provided with SiN anti-reflection coating film is superior to the latter solar cell in respect to the internal quantum efficiency and the short-circuit photo-current density.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A method of preparing a solar cell which comprises:

1) a step of forming an n-type region on a surface of a p-type silicon substrate, and 2) a step of subjecting the n-type region to a phosphorus containing acid treatment at an acid concentration, a temperature, and time sufficient to reduce electron recombination at the surface of said n-type region.

2. The method of preparing a solar cell according to claim 1, wherein said phosphorus containing acid treatment is carried out by dipping the substrate provided with said n-type region into a phosphorus containing acid aqueous solution.

3. The method of preparing a solar cell according to claim 2, wherein said phosphorus containing acid aqueous solution is an aqueous solution of one or more selected from the group consisting of orthophosphoric acid ($H_3PO_4$), phosphorus acid ($H_3PO_2$), metaphosphoric acid ($HPO_3$), and Na, K and $NH_4$ salts of these acids.

4. The method of preparing a solar cell according to claim 1, wherein said phosphorus containing acid treatment is carried out at a temperature of room temperature to 200° C.

5. The method of preparing a solar cell according to claim 4, wherein said p-type substrate and/or said n-type region are amorphous silicon materials.

6. The method of preparing a solar cell according to claim 1, which further comprises a step of forming a silicon nitride layer directly on said n-type region after said phosphorus containing acid treatment.

7. The method of preparing a solar cell according to claim 6, wherein said step of forming a silicon nitride is carried out by a vacuum and thermal CVD method.

8. The method of preparing a solar cell according to claim 7, wherein said p-type substrate and/or said n-type region are amorphous silicon materials.

9. A solar cell having an ability to prevent recombination of electrons near a surface of the cell, which comprises a p-type silicon substrate at a surface provided with an n-type region subjected to a treatment with a phosphorus containing acid and a silicon nitride layer directly formed on the n-type region.

10. The solar cell according to claim 9, wherein the dopant impurity concentration of the n-type region before said phosphoric acid treatment is about $10^{18}$ to $10^{21} cm^{-3}$.

11. The solar cell according to claim 9, wherein a contact resistance between the n-type region and a terminal electrode formed thereon is less than about $10^{-2} \Omega cm^{-2}$.

12. The solar cell according to claim 9, wherein said p-type substrate is a thin film polysilicon layer formed on an insulative layer of $SiO_2$ by a zone-melting recrystallization method and having via holes therethrough, and n-type and p-type electrodes are formed on the bottom surface thereof.

* * * * *